United States Patent
Li et al.

(10) Patent No.: US 10,536,171 B2
(45) Date of Patent: Jan. 14, 2020

(54) ENCODING/DECODING METHOD, DEVICE, AND SYSTEM

(71) Applicant: HUAWEI TECHNOLOGIES CO., LTD., Shenzhen, Guangdong (CN)

(72) Inventors: Bin Li, Shenzhen (CN); Hui Shen, Shenzhen (CN)

(73) Assignee: HUAWEI TECHNOLOGIES CO., LTD., Shenzhen (CN)

(*) Notice: Subject to any disclaimer, the term of this patent is extended or adjusted under 35 U.S.C. 154(b) by 0 days.

(21) Appl. No.: 16/131,879

(22) Filed: Sep. 14, 2018

(65) Prior Publication Data
US 2019/0020358 A1 Jan. 17, 2019

Related U.S. Application Data

(63) Continuation of application No. 14/690,057, filed on Apr. 17, 2015, now Pat. No. 10,103,752, which is a
(Continued)

(30) Foreign Application Priority Data

Oct. 17, 2012 (CN) .......................... 2012 1 0395296

(51) Int. Cl.
*H03M 13/00* (2006.01)
*H03M 13/29* (2006.01)
(Continued)

(52) U.S. Cl.
CPC ....... *H03M 13/2906* (2013.01); *H03M 13/13* (2013.01); *H03M 13/3738* (2013.01);
(Continued)

(58) Field of Classification Search
CPC ......... H03M 13/2906; H03M 13/3738; H03M 13/13; H03M 13/1102; H03M 13/09; H04L 1/00; H04L 1/0059; H04L 1/0045
See application file for complete search history.

(56) References Cited

U.S. PATENT DOCUMENTS 5,838,267 A 11/1998 Wang et al.
2008/0148133 A1 6/2008 Duggan
(Continued)

FOREIGN PATENT DOCUMENTS

CN 1240067 A 12/1999
CN 101689968 A 3/2010
(Continued)

OTHER PUBLICATIONS

Tal et al.,"List Decoding of Polar Codes." pp. 1-11 (May 3, 2012).
(Continued)

*Primary Examiner* — Samir W Rizk
(74) *Attorney, Agent, or Firm* — David William Roe

(57) ABSTRACT

Embodiments of the present disclosure provide an encoding/decoding method, apparatus, and system. The present disclosure is used to improve the decoding performance and improve accuracy of a survivor path. The method includes: encoding information bits to obtain a first-level encoded code word; obtaining a sorting value of each check bit of the first-level encoded code word, and adjusting each check bit to a corresponding position according to the sorting value of each check bit, where the sorting value refers to a value of S when the check bit is related to first S information bits of the information bits in the first-level encoded code word, and S is a non-zero integer; and performing second-level encoding on the first-level encoded code word after positions of the check bits are adjusted, thereby obtaining a second-level encoded code word. The present disclosure is applicable to various communication systems.

19 Claims, 5 Drawing Sheets

Related U.S. Application Data continuation of application No. PCT/CN2013/074907, filed on Apr. 27, 2013.

(51) Int. Cl.

| | | |
|---|---|---|
| *H04L 1/00* | (2006.01) | |
| *H03M 13/13* | (2006.01) | |
| *H03M 13/37* | (2006.01) | |
| *H03M 13/09* | (2006.01) | |
| *H03M 13/11* | (2006.01) | |

(52) U.S. Cl.
CPC .............. *H04L 1/00* (2013.01); *H04L 1/0045* (2013.01); *H04L 1/0059* (2013.01); *H03M 13/09* (2013.01); *H03M 13/1102* (2013.01)

(56) References Cited

U.S. PATENT DOCUMENTS

| | | | |
|---|---|---|---|
| 2008/0320370 A1 | 12/2008 | Shinagawa et al. | |
| 2010/0192047 A1 | 7/2010 | Murakami et al. | |
| 2012/0117443 A1 | 5/2012 | Lee et al. | |
| 2013/0111291 A1 | 5/2013 | Ma | |
| 2014/0019820 A1* | 1/2014 | Vardy | H03M 13/13 714/752 |
| 2014/0169388 A1* | 6/2014 | Jeong | H04L 1/0046 370/474 |

FOREIGN PATENT DOCUMENTS

| | | |
|---|---|---|
| CN | 102077469 A | 5/2011 |
| CN | 102468921 A | 5/2012 |
| CN | 102694625 A | 9/2012 |

OTHER PUBLICATIONS

Eslami et al., "A Practical Approach to Polar Codes," IEEE International Symposium on Information Theory Proceedings, pp. 16-20, Institute of Electrical and Electronics Engineers, New York, New York (2011).

Niu et al., "CRC-Aided Decoding of Polar Codes," IEEE Communications Letters, vol. 16, Issue 10, pp. 1668-1671, Institute of Electrical and Electronics Engineers New York, New York (Oct. 2012).

Zadeh et al., "An Adaptive M-Algorithm Convolutional Decoder," pp. 2177-2181, Institute of Electrical and Electronics Engineers, New York, New York (2005).

Cadambe et al.,"Interference Alignment and Spatial Degrees of Freedom for the K User Interference Channel," IEEE Transactions of Information Theory, Institute of Electrical and Electronics Engineers, New York, New York (Aug. 2008).

* cited by examiner

ENCODING/DECODING METHOD, DEVICE, AND SYSTEM

CROSS-REFERENCE TO RELATED APPLICATION

This application is a continuation of U.S. patent application Ser. No. 14/690,057, filed on Apr. 17, 2015, which is a continuation of International Application No. PCT/CN2013/074907, filed on Apr. 27, 2013. The International Application claims priority to Chinese Patent Application No. 201210395296.2, filed on Oct. 17, 2012. All of the aforementioned patent applications are hereby incorporated by reference in their entireties.

TECHNICAL FIELD

The present disclosure relates to the communications field, and in particular, to an encoding/decoding method, device, and system.

BACKGROUND

In the prior art, after an information bit is checked in a communication channel according to a cyclic redundancy check (CRC) check code, the information bit and the CRC check code are encoded according to an encoding method and then, transmitted to a destination end. The destination end may perform decoding by using an SC (successive-cancellation, successive cancellation) decoding method.

However, after the information bit is checked by using CRC, the information bit and the CRC check code are encoded by using the encoding method and then, transmitted to the destination end, where the destination end uses the SC decoding method. Since the SC decoding quality of the SC decoding method is poor when the code length N is small or medium, the decoding performance is decreased, which reduces user experience.

SUMMARY

Embodiments of the present disclosure provide an encoding/decoding method, apparatus, and system, so as to improve the decoding performance and improve accuracy of a survivor path.

To achieve the above objectives, the embodiments of the present disclosure adopt the following technical solutions.

In a first aspect, an embodiment of the present disclosure provides an encoding method, including: encoding information bits according to a first-level encoding method to obtain a first-level encoded code word, where the first-level encoded code word includes the information bits and check bits; obtaining a sorting value of each check bit of the first-level encoded code word, and adjusting each check bit to a corresponding position according to the sorting value of each check bit, where the sorting value refers to a value of S when the check bit is related to first S information bits of the information bits in the first-level encoded code word, and S is a non-zero integer; and performing, according to a second-level encoding method, second-level encoding on the first-level encoded code word after positions of the check bits are adjusted, thereby obtaining a second-level encoded code word.

In a first possible implementation manner, the adjusting each check bit to a corresponding position according to the sorting value of each check bit includes: adjusting, according to the sorting value of each check bit, each check bit separately to a next position of an $S^{th}$ information bit corresponding to the check bit according to a specific sequence.

With reference to the first aspect or the first possible implementation manner of the first aspect, in a second possible implementation manner, the obtaining a sorting value of each check bit of the first-level encoded code word includes: determining a generator matrix, where a column vector of the generator matrix corresponds to each check bit of the first-level encoded code word; and obtaining a sorting value of the column vector corresponding to each check bit of the first-level encoded code word by using the generator matrix; and the adjusting each check bit to a corresponding position according to the sorting value of each check bit includes: obtaining the sorting value of the column vector corresponding to each check bit of the first-level encoded code word according to the generator matrix, and adjusting each check bit separately to the corresponding position according to a specific sequence.

In a second aspect, an embodiment of the present disclosure provides a decoding method, including: receiving a second-level encoded code word, where the second-level encoded code word includes a first-level encoded code word, and the first-level encoded code word includes information bits and check bits, where the check bits are adjusted to corresponding positions of the information bits; and decoding each bit of the second-level encoded code word in sequence according to a second-level decoding algorithm, and outputting current M survivor paths according to L survivor paths output last time, where L is an integer not smaller than 1 and not greater than a first integer, M is an integer not smaller than 1 and not greater than the first integer, and the M survivor paths include information related to decoded information bits.

In a first possible implementation manner, the outputting current M survivor paths according to L survivor paths output last time includes: if the check bits in the first-level encoded code word are decoded, checking the L survivor paths according to the check bits in the first-level encoded code word; and outputting the current M survivor paths according to a result of checking the L survivor paths.

With reference to the second aspect or the first possible implementation manner of the second aspect, in a second possible implementation manner, the decoding method further includes: determining a generator matrix; and the checking the L survivor paths according to the check bits in the first-level encoded code word includes: determining each survivor path among the L survivor paths as a row vector, where an element of the row vector includes: the information related to the decoded information bit included in the survivor path corresponding to the row vector, and an un-decoded information bit, where the un-decoded information bit is represented as 0; multiplying the row vectors separately by column vectors of the generator matrix corresponding to the check bits to obtain L pieces of data to be checked; obtaining reference data according to the decoded check bits in the first-level encoded code word; and checking the data to be checked according to the reference data.

With reference to the second aspect, or the first possible implementation manner of the second aspect, or the second possible implementation manner of the second aspect, in a third possible implementation manner, the outputting the current M survivor paths according to a result of checking the L survivor paths includes: if the result of checking the L survivor paths includes that A survivor paths among the L survivor paths pass the checking, determining the A survivor paths as the current output survivor paths, and outputting the A survivor paths, where A is an integer greater than 0 and not greater than L; and if the result of checking the L survivor paths includes that none of the L survivor paths passes the checking, stopping the decoding.

With reference to the second aspect, or the first possible implementation manner of the second aspect, or the second possible implementation manner of the second aspect, or the third possible implementation manner of the second aspect, in a fourth possible implementation manner, the outputting current M survivor paths according to L survivor paths output last time includes: in case where a last bit of the first-level encoded code word is decoded, if the last bit of the second-level encoded code word is a check bit of the first-level encoded code word, checking the L survivor paths according to the last bit of the first-level encoded code word, and if B survivor paths among the L survivor paths pass the checking, computing a probability of each survivor path among the B survivor paths; and selecting a survivor path having a maximum probability from the B survivor paths as the current output survivor path, and outputting the current survivor path, where B is an integer greater than 0 and not greater than L; and if none of the L survivor paths passes the checking, computing a probability of each survivor path among the L survivor paths; and selecting a survivor path having a maximum probability from the L survivor paths as the current output survivor path, and outputting the current survivor path.

In a third aspect, an embodiment of the present disclosure provides an encoding device, including: an encoding unit, configured to encode information bits according to a first-level encoding method to obtain a first-level encoded code word, where the first-level encoded code word includes the information bits and check bits; a processing unit, configured to obtain a sorting value of each check bit of the first-level encoded code word, and adjust each check bit to a corresponding position according to the sorting value of each check bit, where the sorting value refers to a value of S when the check bit is related to first S information bits of the information bits in the first-level encoded code word, and S is a non-zero integer; where the encoding unit is further configured to perform, according to a second-level encoding method, second encoding on the first-level encoded code word after positions of the check bits are adjusted, thereby obtaining a second-level encoded code word; and a sending unit, configured to send the second-level encoded code word to a decoding device.

In a first possible implementation manner, the processing unit is specifically configured to adjust, according to the sorting value of each check bit, each check bit separately to a next position of a $S^{th}$ information bit corresponding to the check bit according to a specific sequence.

With reference to the third aspect or the first possible implementation manner of the third aspect, in a second possible implementation manner, the processing unit is specifically configured to determine a generator matrix, where a column vector of the generator matrix corresponds to each check bit of the first-level encoded code word; obtain the column vector corresponding to each check bit of the first-level encoded code word by using the generator matrix; obtain a sorting value of the column vector corresponding to each check bit of the first-level encoded code word by using the generator matrix; and obtain the sorting value of the column vector corresponding to each check bit of the first-level encoded code word according to the generator matrix, and adjust each check bit separately to the corresponding position according to a specific sequence.

In a fourth aspect, an embodiment of the present disclosure provides a decoding device, including: a receiving unit, configured to receive a second-level encoded code word, where the second-level encoded code word includes a first-level encoded code word, and the first-level encoded code word includes the information bits and check bits, where the check bits are adjusted to corresponding positions of the information bits; and a processing unit, configured to decode each bit of the second-level encoded code word in sequence according to a second-level decoding algorithm, and output current M survivor paths according to L survivor paths output last time, where L is an integer not smaller than 1 and not greater than a first integer, M is an integer not smaller than 1 and not greater than the first integer, and the survivor path includes information related to a decoded information bit.

In a first possible implementation manner, the processing unit is specifically configured to: if the check bits in the first-level encoded code word are decoded, check the L survivor paths according to the check bits in the first-level encoded code word; and output the current M survivor paths according to a result of checking the L survivor paths.

With reference to the fourth aspect or the first possible implementation manner of the fourth aspect, in a second possible implementation manner, the processing unit is further configured to determine a generator matrix; and the processing unit is specifically configured to determine each survivor path among the L survivor paths as a row vector, where an element of the row vector includes: the information related to the decoded information bit included in the survivor path corresponding to the row vector, and an un-decoded information bit, where the un-decoded information bit is represented as 0; multiply the row vectors separately by column vectors of the generator matrix corresponding to the check bits to obtain L pieces of data to be checked; obtain reference data according to the decoded check bits in the first-level encoded code word; and check the data to be checked according to the reference data.

With reference to the fourth aspect, or the first possible implementation manner of the fourth aspect, or the second possible implementation manner of the fourth aspect, in a third possible implementation manner, the processing unit is specifically configured to: in cases where the result of checking the L survivor paths includes that A survivor paths among the L survivor paths pass the checking, determine the A survivor paths as the current output survivor paths, and output the A survivor paths, where A is an integer greater than 0 and not greater than L; and in cases where the result of checking the L survivor paths includes that none of the L survivor paths passes the checking, stop the decoding.

With reference to the fourth aspect, the first possible implementation manner of the fourth aspect, or the second possible implementation manner of the fourth aspect, or the third possible implementation manner of the fourth aspect, in a fourth possible implementation manner, the processing unit is specifically configured to: in cases where a last bit of the first-level encoded code word is decoded, if the last bit of the first-level encoded code word is a check bit, check the L survivor paths according to the last bit of the first-level encoded code word, and if B survivor paths among the L survivor paths pass the checking, compute a probability of each survivor path among the B survivor paths; and select a survivor path having a maximum probability from the B survivor paths as the current output survivor path, and output the current survivor path, where B is an integer greater than 0 and not greater than L; and if none of the L survivor paths passes the checking, compute a probability of each survivor path among the L survivor paths; and select a survivor path having a maximum probability from the L survivor paths as the current output survivor path, and output the current survivor path.

In a fifth aspect, an embodiment of the present disclosure provides an encoding device, including: a processor, configured to encode information bits according to a first-level encoding method to obtain a first-level encoded code word, where the first-level encoded code word includes the information bits and check bits; where the processor is further configured to obtain a sorting value of each check bit of the first-level encoded code word, and adjust each check bit to a corresponding position according to the sorting value of each check bit, where the sorting value refers to a value of S when the check bit is related to first S information bits of the information bits in the first-level encoded code word, and S is a non-zero integer; and the processor is further configured to perform, according to a second-level encoding method, second encoding on the first-level encoded code word after positions of the check bits are adjusted, thereby obtaining a second-level encoded code word; and a transceiver, configured to send the second-level encoded code word to a decoding device.

In a sixth aspect, an embodiment of the present disclosure provides a decoding device, including: a transceiver, configured to receive a second-level encoded code word, where the second-level encoded code word includes a first-level encoded code word, and the first-level encoded code word includes the information bits and check bits, where the check bits are adjusted to corresponding positions of the information bits; and a processor, configured to decode each bit of the second-level encoded code word in sequence according to a second-level decoding algorithm, and output current M survivor paths according to L survivor paths output last time, where L is an integer not smaller than 1 and not greater than a first integer, M is an integer not smaller than 1 and not greater than the first integer, and the survivor path includes information related to a decoded information bit.

In a seventh aspect, an embodiment of the present disclosure provides an encoding and decoding system, including an encoding device and a decoding device, where the encoding device is an encoding device described in the above embodiments, and the decoding device is a decoding device described in the above embodiments; or the encoding device is the other encoding device described in the above embodiments, and the decoding device is the other decoding device described in the above embodiments.

The embodiments of the present disclosure provide an encoding/decoding method, apparatus, and system, where an encoding device encodes information bits according to a first-level encoding method to obtain a first-level encoded code word, obtains a sorting value of each check bit and adjusts each check bit to a corresponding position according to the sorting value, and finally performs second encoding according to a second-level encoding method to obtain a second-level encoded code word. A decoding device, after receiving the second-level encoded code word, decodes the second-level encoded code word according to a second-level decoding algorithm, and outputs a possible current survivor path according to a last survivor path, thereby obtaining a finally output survivor path. In this way, in the encoding process, in the first-level encoded code word, each check bit is inserted to the information bits, and then the first-level encoded code word is encoded; and in the decoding process, each bit of the second-level code is decoded and a corresponding survivor path is output, so that an information bit code can be decoded regardless of a code length of the information bit code, thereby improving the decoding performance. Moreover, distributed checking may be performed in the decoding process, so that a survivor path that fails the checking can be deleted, and that a survivor path passing the checking is reserved, thereby selecting a path in advance, further improving the decoding performance, improving accuracy of the survivor path, and improving user experience.

BRIEF DESCRIPTION OF DRAWINGS

To illustrate the technical solutions in the embodiments of the present disclosure more clearly, the following briefly introduces the accompanying drawings required for describing the embodiments. Apparently, the accompanying drawings in the following description show merely some embodiments of the present disclosure, and a person of ordinary skill in the art may still derive other drawings from these accompanying drawings without creative efforts.

DESCRIPTION OF EMBODIMENTS

The following clearly describes the technical solutions in the embodiments of the present disclosure with reference to the accompanying drawings in the embodiments of the present disclosure. Apparently, the described embodiments are merely a part rather than all of the embodiments of the present disclosure. All other embodiments obtained by a person of ordinary skill in the art based on the embodiments of the present disclosure without creative efforts shall fall within the protection scope of the present disclosure.

Communication system generally uses a channel encoding method to improve reliability of data transmission and ensure communication quality. A Polar code is a linear block code that can achieve Shannon capacity and has low encoding complexity. An encoding process of a Polar code is $x_1^N = u_1^N G_N$, where $G_N = B_N F^{\otimes n}$, N is a code length and $N = 2^n$, n is an integer not smaller than 0, $$F = \begin{bmatrix} 1 & 0 \\ 1 & 1 \end{bmatrix},$$

and $B_N$ is a transposed matrix. A decoding method corresponding to the Polar code is SC.

Figure 1:
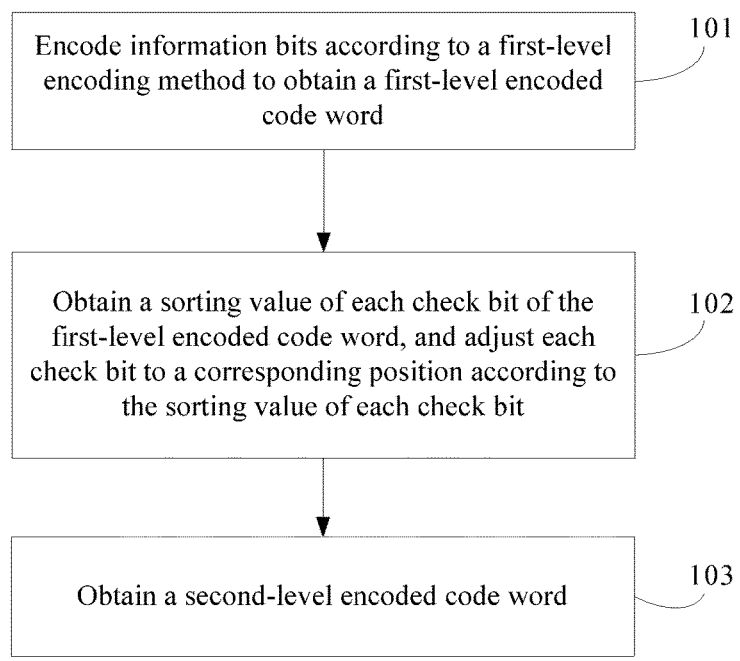
FIG. 1 is a schematic diagram of an encoding method according to an embodiment of the present disclosure.

An embodiment of the present disclosure provides an encoding method, as shown in FIG. 1, including the following:

101. Encode information bits according to a first-level encoding method to obtain a first-level encoded code word.

The first-level encoded code word includes the information bits and check bits.

Further, the first-level encoding method may be a CRC (Cyclic Redundancy Check, cyclic redundancy check) encoding method, or an LDPC (low-density parity-check codes, low-density parity check) encoding method.

It should be noted that, the first-level encoding method may also be another encoding method, which is not limited in the present disclosure.

If the first-level encoding method is the CRC encoding method, the check bits are CRC check bits. If the first-level encoding method is the LDPC encoding method, the check bits are LDPC check bits.

Figure 2:
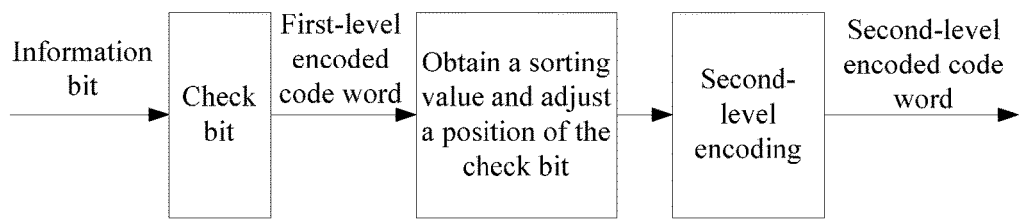
FIG. 2 is a schematic diagram of another encoding method according to an embodiment of the present disclosure.

Specifically, an encoding device adds the check bits to the information bits according to the first-level encoding method, thereby obtaining the first-level encoded code word, as shown in FIG. 2.

The method for the encoding device to obtain the first-level encoded code word according to the first-level encoding method may be a method according to a generator matrix, a method according to a generator polynomial, or another method, which is not limited in the present disclosure. The following description uses the method according to a generator matrix as an example.

The encoding device determines a generator matrix; determines the information bits as elements of a row vector; and multiplies the row vector by the generator matrix to obtain an information bit check matrix.

The number of columns of the row vector is equal to the number of rows of the generator matrix.

Specifically, the encoding device may determine the generator matrix according to a generator polynomial of the check bits, generate a row vector according to the information bits, and multiply the row vector by the generator matrix, thereby obtaining the first-level encoded code word.

It should be noted that, the generator matrix may be preset, and the mode of obtaining the generator matrix is not limited in the present disclosure.

For example, the number of bits of the information bits is 1008, and check bits are CRC check bits. The encoding device may obtain a CRC generator matrix according to a generator polynomial of the CRC check bits, where the generator matrix is a 1008×1024 matrix.

In the generator matrix, the first 1008 columns may be deemed as a unit matrix, and elements of the last 16 columns are check bits of the CRC check bits. In other words, the generator matrix may be deemed as [I $P_{CRC}$], where I is a 1008×1008 unit matrix, and $P_{CRC}$ is a 1008×16 matrix.

The 1008 bits of the information bits are used as a row vector n, and in this case, the row vector n is multiplied by the generator matrix, thereby obtaining a 1×1024 first-level encoded code word.

102. Obtain a sorting value of each check bit of the first-level encoded code word, and adjust each check bit to a corresponding position according to the sorting value of each check bit.

The sorting value refers to a value of S when the check bit is related to first S information bits of the information bits in the first-level encoded code word, and S is a non-zero integer.

For example, a sorting value of a check bit is 10, indicating that the check bit is related to first 10 bits of an information bit code.

Specifically, the encoding device, after detecting the sorting value of each check bit, adjusts, according to the sorting value of each check bit, each check bit separately to a next position of a $S^{th}$ information bit corresponding to the check bit according to a specific sequence.

It should be noted that, if two check bits 'a' and 'b' have the same sorting value, for example, the sorting value is 3, after the check bit a is adjusted to be after a third information bit and before a fourth information bit of the information bits, the check bit 'b' may be adjusted to be after the check bit 'a' and before the fourth information bit, or may be adjusted to be after the third information bit and before the check bit 'a', which is not limited in the present disclosure.

It should be noted that, the adjusting the check bits to positions in the information bits refers to adjusting the check bits to corresponding positions in the information bits when no check bit is included. For example, the sorting values of the check bits 'a' and 'b' are 4 and 5 respectively. The check bit 4 is adjusted to be after a fourth information bit and before a fifth information bit of the information bits, that is, a position 5. The check bit 'b' is adjusted to be after the fifth information bit and before a sixth information bit of the information bits. Because the check bit 'a' is inserted to the information bits before, the check bit 'b' is adjusted to a position 7.

For example, an information bit code has 12 bits, and the information bit code is 1100 0011 1010; and check bits are CRC check bits, and the CRC check bits are four bits which are respectively 'a', 'b', 'c', and 'd'. In this case, a first-level encoded code word generated after the information bits are checked according to the CRC check bits is 1100 0011 1010 abcd.

If the 4 CRC check bits: 'a', 'b', 'c', and 'd' are detected, sorting values related to the information bits are respectively 12, 5, 5, and 10.

According to the sorting values, it can be known that, the check bit 'b' is related to first five bits of the information bits. The check bit 'c' is related to first five bits of the information bits. The check bit 'd' is related to first 10 bits of the information bits. The check bit 'a' is related to first 12 bits of the information bits.

According to an ascending order of the sorting values, first, the check bit 'b' may be inserted to a next position of the fifth information bit of the information bits, that is, inserted after the fifth information bit and before a sixth information bit of the information bits. The check bit 'c' is inserted to a next position of the fifth information bit of the information bits. Because the check bit 'b' is inserted to the next position of the fifth information bit of the information bits, the check bit 'c' is inserted to a next position of the check bit 'b', that is, after the check bit 'b' and before the sixth information bit. The check bit 'd' is inserted to a next position of a $10^{th}$ information bit of the information bits, that is, inserted after the $10^{th}$ information bit and before an $11^{th}$ information bit of the information bits. The check bit 'a' is inserted to a next position of a $12^{th}$ information bit of the information bits, that is, inserted after the $12^{th}$ information bit of the information bits. In this case, after all check bits of the CRC check bits are adjusted to the corresponding positions in the information bits, the first-level encoded code word obtained after the check bits are adjusted is 1100 0bc0 1110 d10a.

Further, the encoding device may determine the sorting value of each check bit of the first-level code according to a method of a generator matrix.

Specifically, a generator matrix is determined; and a sorting value of a column vector corresponding to each check bit of the first-level encoded code word is obtained by using the generator matrix. According to the sorting value of the column vector corresponding to each check bit of the first-level encoded code word in the generator matrix, each check bit is adjusted separately to the corresponding position according to a specific sequence.

The column vector of the generator matrix corresponds to each check bit of the first-level encoded code word.

It should be noted that, a part of column vectors of the generator matrix may correspond to each check bit of the first-level encoded code word, or all column vectors of the generator matrix may correspond to each check bit of the first-level encoded code word, which is not limited in the present disclosure.

Specifically, the encoding device obtains a sequence number of a first non-zero value of an inverse column vector corresponding to each check bit of the first-level encoded code word in the generator matrix as the sorting value of the column vector corresponding to each check bit of the first-level encoding in the generator matrix; or obtains a sequence number of a last non-zero value of a sequential column vector corresponding to each check bit of the first-level encoded code word in the generator matrix as the sorting value of the column vector corresponding to each check bit of the first-level encoded code word in the generator matrix.

According to the obtained sequence number of the column vector corresponding to each check bit of the first-level code in the generator matrix, the column vector corresponding to each check bit of the first-level code in each generator matrix is adjusted to a next column of the column vector corresponding to the sequence number according to a specific sequence.

For example, in the generator matrix, a sorting value of a column vector corresponding to a check bit is 10, indicating that for the column vector corresponding to the check bit, and a sequential sequence number of a last non-zero value is 10. The column vector corresponding to the check bit may be inserted to a next column following the column vector of the information bits corresponding to the sequence number 10.

103. Perform, according to a second-level encoding method, second-level encoding on the first-level encoded code word after positions of the check bits are adjusted, thereby obtaining a second-level encoded code word.

Optionally, the second-level encoding method of the encoding device is a Polar encoding method, as shown in FIG. 2.

It should be noted that, the encoding method at a sending end may also be another encoding method, for example, convolutional encoding, which is not limited in the present disclosure.

It should be noted that, the second-level encoding method of the encoding device is preset. Moreover, the decoding device can be preset to learn the encoding method used by a second-level encoding device.

The embodiment of the present disclosure provides an encoding method, where an encoding device end performs first-level encoding on information bits to obtain a first-level encoded code word, obtains a sorting value of each check bit and adjusts each check bit to a corresponding position according to the sorting value, and finally performs second-level encoding according to a second-level encoding method to obtain a second-level encoded code word. In this way, in the encoding process, in the first-level encoded code word, each check bit is inserted to the information bits, and then second-level encoding is performed on the first-level encoded code word after the sorting and insertion.

Figure 3:
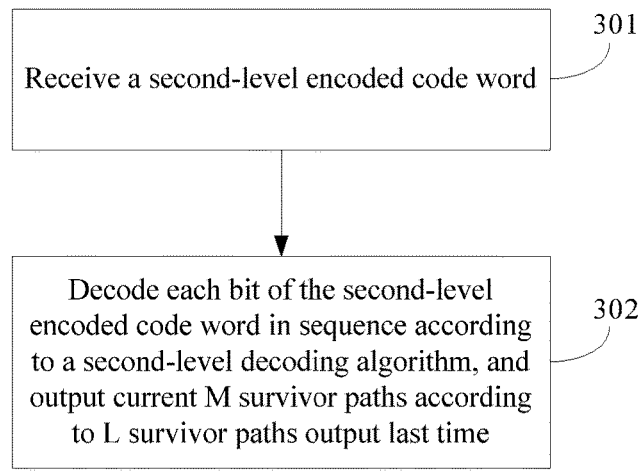
FIG. 3 is a schematic diagram of a decoding method according to an embodiment of the present disclosure.

An embodiment of the present disclosure provides a decoding method, as shown in FIG. 3, including the following:

301. Receive a second-level encoded code word.

The second-level encoded code word includes a first-level encoded code word. The first-level encoded code word includes the information bits and check bits, where the check bits are adjusted to corresponding positions of the information bits.

Specifically, a decoding device receives the second-level encoded code word on which an encoding device performs second-level encoding, that is, receives a code sequence.

It should be noted that, the decoding device is preset to be aware of the encoding method used by the encoding device.

The check bits may be CRC check bits, LDPC check bits, or any other check bits known to one skilled in the art.

302. Decode each bit of the second-level encoded code word in sequence according to a second-level decoding algorithm, and output current M survivor paths according to L survivor paths output last time.

L is an integer not smaller than 1 and not greater than a first integer. M is an integer not smaller than 1 and not greater than the first integer. The survivor path includes information related to a decoded information bit.

It should be noted that, the first integer is a maximum number of survivor paths that can be output, where the maximum number is set by the decoding device in advance.

It should be noted that, the second-level decoding algorithm is preset according to a second-level encoding algorithm of the encoding device.

Further, if the second-level encoding method of the encoding device is a Polar encoding method, the second-level decoding algorithm of the decoding device is a Polar decoding method.

Specifically, according to the second-level decoding algorithm, the received second-level encoded code word is decoded bit by bit. That is to say, each bit of the code sequence is decoded. Each time a bit is decoded, a current survivor path is output according to a survivor path output last time.

If the decoding device, after receiving the second-level encoded code word, decodes a first bit of the second-level encoded code word, and the decoded first bit of the second-level encoded code word is a bit of an information bit code of the first-level encoded code word, two possible survivor paths are output, where information related to the first bit included in one survivor path is 0, and information related to the first bit included in another survivor path is 1.

If the decoding device continues to decode the second-level encoded code word, and if a bit of the information bit code of the first-level encoded code word is decoded, the current M survivor paths are output according to the L survivor paths output last time. M is two times L.

For example, if four survivor paths are output last time, when a third bit in the code sequence is decoded, if the third bit in the code sequence is decoded as an information bit after the first-level encoding, eight current survivor paths are output according to the four survivor paths output last time.

Figure 4:
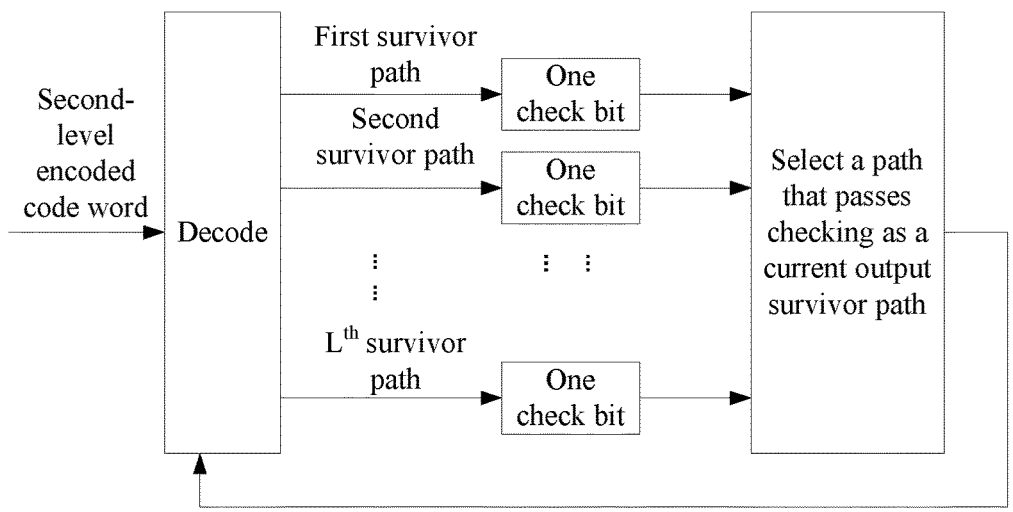
FIG. 4 is a schematic diagram of another decoding method according to an embodiment of the present disclosure.

If the decoding device decodes a check bit in the first-level encoded code word, as shown in FIG. 4, the L survivor paths are checked according to the check bits in the first-level encoded code word; and the current M survivor paths are output according to a result of checking the L survivor paths.

In this case, the decoding device determines a generator matrix.

It should be noted that, the generator matrix of the decoding device is related to the first-level encoding method of the encoding device.

Specifically, each survivor path among the L survivor paths is determined as a row vector, that is, L row vectors are obtained. The row vectors are separately multiplied by column vectors of the generator matrix corresponding to the check bits to obtain L pieces of data to be checked. Reference data is obtained according to the decoded check bits in the first-level encoded code word. The data to be checked is checked according to the reference data.

An element of the row vector includes: the information related to the decoded information bit included in the survivor path corresponding to the row vector, and an un-decoded information bit. The un-decoded information bit is represented as 0.

Optionally, the first-level decoding method may be a CRC decoding method, an LDPC decoding method, or another decoding method.

If the result of checking the L survivor paths includes that A survivor paths among the L survivor paths pass the checking, the A survivor paths are determined as the current output survivor paths, and the A survivor paths are output. (L-A) survivor paths that fail the checking are deleted.

A is an integer greater than 0 and not greater than L.

If the result of checking the L survivor paths includes that none of the L survivor paths passes the checking, the decoding is stopped in advance.

Further, the checking the data to be checked according to the reference data is: comparing the L pieces of data to be checked with the reference data; if the data to be checked is the same as the reference data, determining that the data to be checked passes the checking; and if the data to be checked is different from the reference data, determining that the data to be checked fails the checking.

In cases where a last bit of the second-level encoded code word is decoded, if the decoded last bit of the second-level encoded code word is a check bit of the first-level encoded code word, the L survivor paths are checked according to the check bits of the first-level encoded code word, and if B survivor paths among the L survivor paths pass the checking, a probability of each survivor path among the B survivor paths is computed.

Specifically, the probability of each survivor path among the B survivor paths is computed separately according to other probabilities such as a path probability and a bit value probability of each survivor path among the B survivor paths.

A survivor path having a maximum probability is selected from the B survivor paths as the current output survivor path, and the current survivor path is output.

B is an integer greater than 0 and not greater than L. In this case, M is 1.

If none of the L survivor paths passes the checking, a probability of each survivor path among the L survivor paths is computed.

A survivor path having a maximum probability is selected from the L survivor paths as the current output survivor path, and the current survivor path is output.

In this case, M is 1.

The embodiment of the present disclosure provides a decoding method, where a decoding device, after receiving a second-level encoded code word, decodes the received second-level encoded code word according to a decoding algorithm, and outputs a current possible survivor path according to a last survivor path, and when a check bit is decoded, uses a survivor path that passes the checking as the current output survivor path, and deletes a survivor path that fails the checking, thereby obtaining a finally output survivor path. In this way, in a decoding process, each bit of the second-level encoded code word is decoded and a corresponding survivor path is output, so that data transmitted by a user can be correctly decoded, thereby improving the decoding performance and improving user experience. Moreover, distributed checking can be performed in the decoding process, so that a survivor path that fails the checking can be deleted, and that a survivor path passing the checking is reserved, thereby selecting a path in advance, improving accuracy of the survivor path, further improving the decoding performance, decreasing decoding complexity, and improving the user experience.

Figure 5:
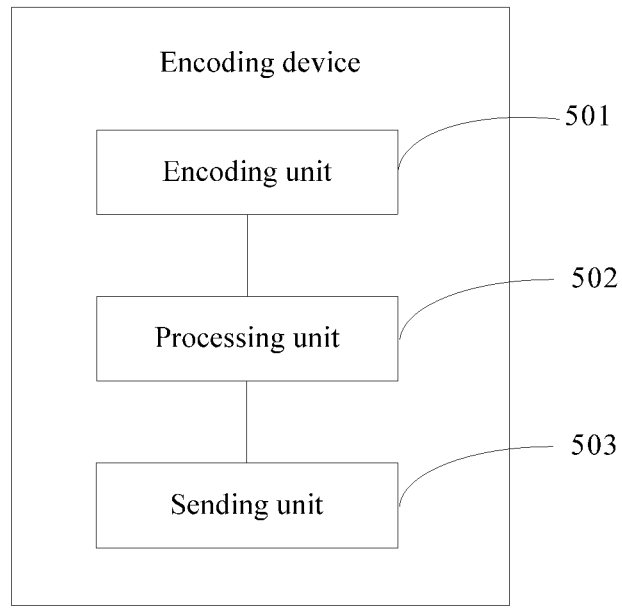
FIG. 5 is a schematic structural diagram of an encoding device according to an embodiment of the present disclosure.
Figure 6:
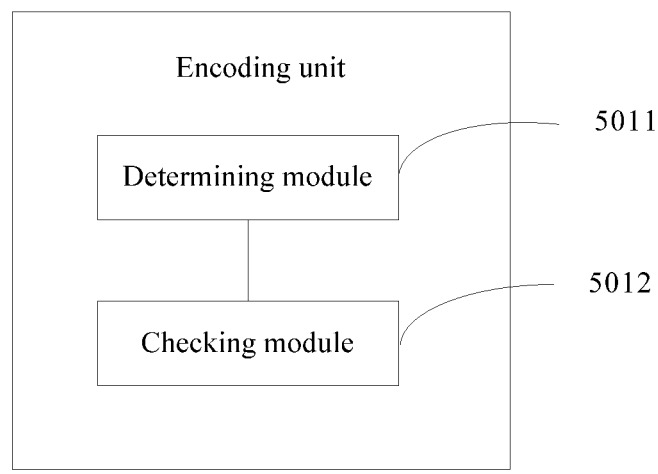
FIG. 6 is a schematic structural diagram of an encoding unit of the encoding device illustrated in FIG. 5.

An embodiment of the present disclosure provides an encoding device, as shown in FIG. 5, including the following:

An encoding unit 501 is configured to encode information bits according to a first-level encoding method to obtain a first-level encoded code word.

The first-level encoded code word includes the information bits and check bits.

Optionally, the first-level encoding method may be a cyclic redundancy check CRC encoding method, or a low-density parity check LDPC encoding method.

Further, if the first-level encoding method is the CRC encoding method, the check bits are CRC check bits. If the first-level encoding method is the LDPC encoding method, the check bits are LDPC check bits.

A processing unit 502 is configured to obtain a sorting value of each check bit of the first-level encoded code word, and adjust each check bit to a corresponding position according to the sorting value of each check bit.

The sorting value refers to a value of S when the check bit is related to first S information bits of the information bits in the first-level encoded code word. S is a non-zero integer.

Specifically, the processing unit 502 is specifically configured to adjust, according to the sorting value of each check bit, each check bit separately to a next position of an $S^{th}$ information bit corresponding to the check bit according to a specific sequence.

Further, the processing unit 502 is specifically configured to determine a generator matrix; obtain a sorting value of a column vector corresponding to each check bit of the first-level encoded code word by using the generator matrix;

and according to the sorting value of the column vector corresponding to each check bit of the first-level code in the generator matrix, adjust each check bit separately to the corresponding position according to a specific sequence.

Each column vector of the generator matrix corresponds to each check bit of the first-level code.

Specifically, the processing unit 502 is specifically configured to obtain a sequence number of a first inverse non-zero value of the column vector corresponding to each check bit of the first-level code in the generator matrix; or obtain a sequence number of a last sequential non-zero value of the column vector corresponding to each check bit of the first-level code in the generator matrix.

According to the obtained sequence number of the column vector corresponding to each check bit of the first-level code in the generator matrix, adjust the column vector corresponding to each check bit of the first-level encoded code word in each generator matrix to a next column of the column vector corresponding to the sequence number according to a specific sequence.

The encoding unit 501 is further configured to perform, according to a second-level encoding method, second encoding on the first-level encoded code word after positions of the check bits are adjusted, thereby obtaining a second-level encoded code word.

Optionally, the second-level encoding method includes a Polar encoding method.

A sending unit 503 is configured to send the second-level encoded code word to a decoding device.

The embodiment of the present disclosure provides an encoding device, which performs first encoding to obtain a first-level encoded code word, obtains a sorting value of each check bit and adjusts each check bit to a corresponding position according to the sorting value, and finally performs second-level encoding according to a second-level encoding method to obtain a second-level encoded code word. In this way, in an encoding process, in the first-level encoded code word, each check bit is inserted to the corresponding position, and the first-level encoded code word after the insertion is encoded; therefore, in a decoding process under such encoding, each bit of the second-level encoded code word is decoded in a distributed manner, and a corresponding survivor path is output, so that an incorrect path is stopped in advance, thereby reducing unnecessary computation, reducing computation complexity, and ensuring that all survivor paths are valid paths, so as to improve accuracy of the survivor paths, improve the decoding performance, and improve user experience.

Figure 7:
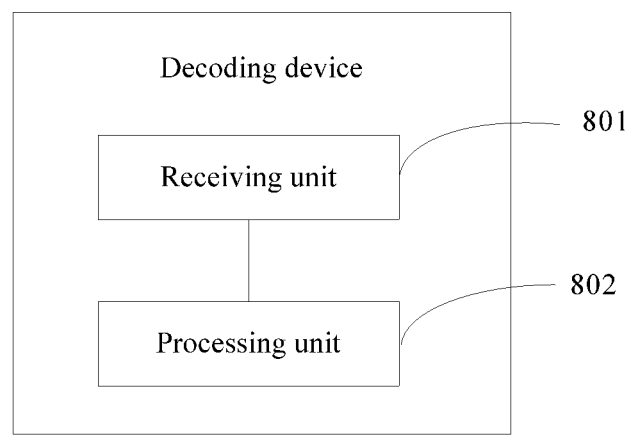
FIG. 7 is a schematic structural diagram of a decoding device according to an embodiment of the present disclosure.

An embodiment of the present disclosure provides a decoding device, as shown in FIG. 7, including the following:

A receiving unit 801 is configured to receive a second-level encoded code word.

The second-level encoded code word includes a first-level encoded code word. The first-level encoded code word includes the information bits and check bits, where the check bits are adjusted to corresponding positions of the information bits.

Further, the check bits may be cyclic redundancy check CRC check bits, low-density parity check LDPC check bits, or other check bits.

A processing unit 802 is configured to decode each bit of the second-level encoded code word in sequence according to a second-level decoding algorithm, and output current M survivor paths according to L survivor paths output last time.

L is an integer not smaller than 1 and not greater than a first integer, M is an integer not smaller than 1 and not greater than the first integer, and the survivor path includes information related to a decoded information bit.

Optionally, the second-level decoding algorithm includes a Polar decoding method.

Specifically, the processing unit 802 is specifically configured to: if information bits of the first-level encoded code word are decoded, output the M survivor paths according to the L survivor paths output last time.

M is two times L.

If the check bits in the first-level encoded code word are decoded, the L survivor paths are checked according to the check bits in the first-level encoded code word; and the current M survivor paths are output according to a result of checking the L survivor paths.

The processing unit 802 is further configured to determine a generator matrix.

Specifically, the processing unit 802 is specifically configured to determine each survivor path among the L survivor paths as a row vector; multiply the row vectors separately by column vectors of the generator matrix corresponding to the check bits to obtain L pieces of data to be checked; obtain reference data according to the decoded check bits in the first-level encoded code word; and check the data to be checked according to the reference data.

An element of the row vector includes: the information related to the decoded information bit included in the survivor path corresponding to the row vector, and an un-decoded information bit. The un-decoded information bit is represented as 0.

Optionally, the first-level decoding method may be a CRC decoding method, an LDPC decoding method, or another decoding method.

In cases where the result of checking the L survivor paths includes that A survivor paths among the L survivor paths pass the checking, the A survivor paths are determined as the current output survivor paths, and the A survivor paths are output.

A is an integer greater than 0 and not greater than L.

In cases where the result of checking the L survivor paths includes that none of the L survivor paths passes the checking, the decoding is stopped.

The processing unit 802 is specifically configured to: in cases where a last bit of the second-level encoded code word is decoded, if the decoded last bit of the second-level encoded code word is a check bit of the first-level encoded code word, check the L survivor paths according to the check bits of the first-level encoded code word, and if B survivor paths among the L survivor paths pass the checking, compute a probability of each survivor path among the B survivor paths; and select a survivor path having a maximum probability from the B survivor paths as the current output survivor path, and output the current survivor path.

B is an integer greater than 0 and not greater than L. In this case, M is 1.

If none of the L survivor paths passes the checking, a probability of each survivor path among the L survivor paths is computed, and a survivor path having a maximum probability is selected from the L survivor paths as the current output survivor path, and the current survivor path is output.

In this case, M is 1.

The embodiment of the present disclosure provides a decoding device, which, after receiving a second-level encoded code word, decodes the received second-level encoded code word according to a decoding algorithm and outputs a current possible survivor path according to a last survivor path, and when a check bit is decoded, uses a survivor path that passes checking as the current output survivor path, and deletes a survivor path that fails the checking, thereby obtaining a finally output survivor path. In this way, in a decoding process, each bit of the second-level encoded code word is decoded, and a corresponding survivor path is output, which improves the decoding performance and improves user experience. Moreover, checking can be performed in the decoding process, so that a survivor path that fails the checking can be deleted, and that a survivor path passing the checking is reserved, thereby selecting a path in advance, improving accuracy of the survivor path, further improving the decoding performance, decreasing decoding complexity, and improving the user experience.

Figure 8:
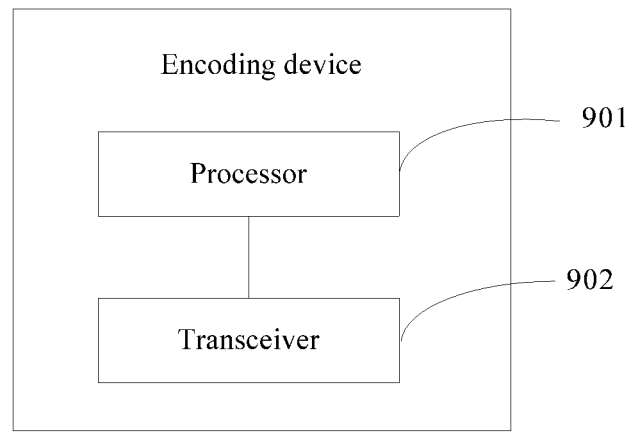
FIG. 8 is a schematic structural diagram of another encoding device according to an embodiment of the present disclosure.

An embodiment of the present disclosure provides an encoding device, as shown in FIG. 8, including the following:

A processor 901 is configured to encode information bits according to a first-level encoding method to obtain a first-level encoded code word.

The first-level encoded code word includes the information bits and check bits.

Optionally, the first-level encoding method may be a cyclic redundancy check CRC encoding method, or a low-density parity check LDPC encoding method. Each of these methods may be referred to as non-polar encoding methods.

Further, if the first-level encoding method is the CRC encoding method, the check bits are CRC check bits. If the first-level encoding method is the LDPC encoding method, the check bits are LDPC check bits.

The processor 901 is further configured to obtain a sorting value of each check bit of the first-level encoded code word, and adjust each check bit to a corresponding position according to the sorting value of each check bit.

The sorting value refers to a value of S when the check bit is related to first S information bits of the information bits in the first-level encoded code word. S is a non-zero integer.

Specifically, the processor 901 is specifically configured to adjust, according to the sorting value of each check bit, each check bit separately to a next position of an St' information bit corresponding to the check bit according to a specific sequence.

Further, the processor 901 is specifically configured to determine a generator matrix; obtain a sorting value of a column vector corresponding to each check bit of the first-level encoded code word by using the generator matrix; and according to the sorting value of the column vector corresponding to each check bit of the first-level encoded code word in the generator matrix, adjust each check bit separately to the corresponding position according to a specific sequence.

Each column vector of the generator matrix corresponds to each check bit of the first-level encoded code word.

Specifically, the processor 901 is specifically configured to obtain a sequence number of a first inverse non-zero value of the column vector corresponding to each check bit of the first-level encoded code word in the generator matrix; or obtain a sequence number of a last sequential non-zero value of the column vector corresponding to each check bit of the first-level encoded code word in the generator matrix; and according to the obtained sequence number of the column vector corresponding to each check bit of the first-level encoded code word in the generator matrix, adjust the column vector corresponding to each check bit of the first-level encoded code word in each generator matrix to a next column of the column vector corresponding to the sequence number according to a specific sequence.

The processor 901 is further configured to perform, according to a second-level encoding method, second encoding on the first-level encoded code word after positions of the check bits are adjusted, thereby obtaining a second-level encoded code word.

Optionally, the second-level encoding method includes a Polar encoding method.

A transceiver 902 is configured to send the second-level encoded code word to a decoding device.

The embodiment of the present disclosure provides an encoding device, which performs first-level encoding to obtain a first-level encoded code word, obtains a sorting value of each check bit and adjusts each check bit to a corresponding position according to the sorting value, and finally performs second-level encoding according to an second-level encoding method to obtain a second-level encoded code word. In this way, in an encoding process, in the first-level encoded code word, each check bit is inserted to the corresponding position, and the first-level encoded code word after the insertion is encoded; therefore, in a decoding process under such encoding, each bit of the second-level encoded code word is decoded in a distributed manner, and a corresponding survivor path is output, so that an incorrect path is stopped in advance, thereby reducing unnecessary computation, reducing computation complexity, and ensuring that all survivor paths are valid paths, so as to improve accuracy of the survivor paths, improve the decoding performance, and improve user experience.

Figure 9:
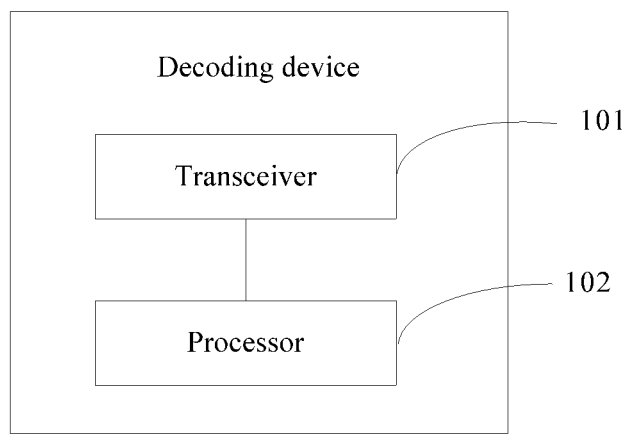
FIG. 9 is a schematic structural diagram of another decoding device according to an embodiment of the present disclosure.

An embodiment of the present disclosure provides a decoding device, as shown in FIG. 9, including the following:

A transceiver 101 is configured to receive a second-level encoded code word.

The second-level encoded code word includes a first-level encoded code word. The first-level encoded code word includes the information bits and check bits, where the check bits are adjusted to corresponding positions of the information bits.

Further, the check bits may be cyclic redundancy check CRC check bits, low-density parity check LDPC check bits, or other check bits.

A processor 102 is configured to decode each bit of the second-level encoded code word in sequence according to a second-level decoding algorithm, and output current M survivor paths according to L survivor paths output last time.

L is an integer not smaller than 1 and not greater than a first integer, M is an integer not smaller than 1 and not greater than the first integer, and the survivor path includes information related to a decoded information bit code.

Optionally, the second-level decoding algorithm includes a Polar decoding method.

Specifically, the processor 102 is specifically configured to: if information bits of the first-level encoded code word are decoded, output the M survivor paths according to the L survivor paths output last time.

M is two times L.

If the check bits in the first-level encoded code word are decoded, the L survivor paths are checked according to the check bits in the first-level encoded code word; and the current M survivor paths are output according to a result of checking the L survivor paths.

The processor 102 is further configured to determine a generator matrix.

Specifically, the processor 102 is specifically configured to determine each survivor path among the L survivor paths as a row vector; multiply the row vectors separately by column vectors of the generator matrix corresponding to the check bits to obtain L pieces of data to be checked; obtain reference data according to the decoded check bits in the first-level encoded code word; and check the data to be checked according to the reference data.

An element of the row vector includes: the information related to the decoded information bit included in the survivor path corresponding to the row vector, and an un-decoded information bit. The un-decoded information bit is represented as 0.

Optionally, the first-level decoding method may be a CRC decoding method, an LDPC decoding method, or another decoding method.

In cases where the result of checking the L survivor paths includes that, the result of checking the L survivor paths includes that A survivor paths among the L survivor paths pass the checking, the A survivor paths are determined as the current output survivor paths, and the A survivor paths are output.

A is an integer greater than 0 and not greater than L.

In cases where the result of checking the L survivor paths includes that none of the L survivor paths passes the checking, the decoding is stopped.

In cases where a last bit of the second-level encoded code word is decoded, if the decoded last bit of the second-level encoded code word is a check bit of the first-level encoded code word, the L survivor paths are checked according to the check bits of the first-level encoded code word, and if B survivor paths among the L survivor paths pass the checking, a probability of each survivor path among the B survivor paths is computed; and a survivor path having a maximum probability is selected from the B survivor paths as the current output survivor path, and the current survivor path is output.

B is an integer greater than 0 and not greater than L. In this case, M is 1.

If none of the L survivor paths passes the checking, a probability of each survivor path among the L survivor paths is computed.

A survivor path having a maximum probability is selected from the L survivor paths as the current output survivor path, and the current M survivor paths are output. In this case, M is 1.

The embodiment of the present disclosure provides a decoding device, which, after receiving a second-level encoded code word, decodes the received second-level encoded code word according to a decoding algorithm and outputs a current possible survivor path according to a last survivor path, and when a check bit is decoded, uses a survivor path that passes checking as the current output survivor path, and deletes a survivor path that fails the checking, thereby obtaining a finally output survivor path. In this way, in a decoding process, distributed checking is performed, and the decoding can be stopped in advance, which improves the decoding performance and improves user experience. Moreover, checking can be performed in the decoding process, so that a survivor path that fails the checking can be deleted, and that a survivor path passing the checking is reserved, thereby selecting a path in advance, improving accuracy of the survivor path, further improving the decoding performance, decreasing decoding complexity, and improving the user experience.

Figure 10:
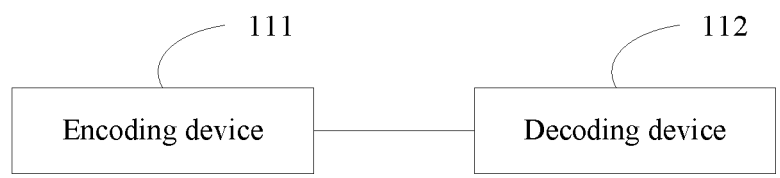
FIG. 10 is a schematic diagram of an encoding and decoding system according to an embodiment of the present disclosure.

An embodiment of the present disclosure provides an encoding and decoding system, as shown in FIG. 10, including an encoding device 111 and a decoding device 112. The encoding device 111 is the encoding device described in the above embodiments, and the decoding device 112 is the decoding device described in the above embodiments; or the encoding device 111 is the other encoding device described in the above embodiments, and the decoding device 112 is the other decoding device described in the above embodiments.

The embodiments of the present disclosure provide an encoding/decoding method, apparatus, and system, where an encoding device encodes information bits according to check bits to obtain a first-level encoded code word, obtains a sorting value of each check bit and adjusts each check bit to a corresponding position according to the sorting value, and finally performs second encoding according to an second-level encoding method to obtain a second-level encoded code word. A corresponding decoding device, after receiving the second-level encoded code word, decodes the received second-level encoded code word according to a decoding algorithm and outputs a current possible survivor path according to a last survivor path, and when a check bit is decoded, uses a survivor path that passes checking as the current output survivor path, and deletes a survivor path that fails the checking, thereby obtaining a finally output survivor path. In this way, in a decoding process, each bit of the second-level encoded code word is decoded, and a corresponding survivor path is output; and distributed checking is performed, and the decoding can be stopped in advance, thereby improving the decoding performance and improving user experience. Moreover, checking can be performed in the decoding process, so that a survivor path that fails the checking can be deleted, and that a survivor path passing the checking is reserved, thereby selecting a path in advance, improving accuracy of the survivor path, further improving the decoding performance, decreasing decoding complexity, and improving the user experience.

The foregoing descriptions are merely specific embodiments of the present disclosure, but are not intended to limit the protection scope of the present disclosure. Any variation or replacement readily figured out by a person skilled in the art within the technical scope disclosed in the present disclosure shall fall within the protection scope of the present disclosure. Therefore, the protection scope of the present disclosure shall be subject to the protection scope of the claims.

What is claimed is:

1. An encoding method, the method comprising:
   encoding, by an encoding device, a plurality of information bits to obtain a first encoded code word that comprises the plurality of information bits and a plurality of check bits, wherein the first check bit of the plurality of check bits is positioned after S information bits and before $(S+1)^{th}$ information bit of the first encoded code word, and S equals to a number of information bits related to the first check bit and is an integer of at least 1; and
   polar encoding, by the encoding device, the first encoded code word to obtain a second encoded code word.

2. The method according to claim 1, the value of S is obtained by:
   obtaining the value of S according to a sorting value of a column vector of a generator matrix corresponding to the first check bit.

3. The method according to claim 2, wherein the method further comprises obtaining a sequence number as the value of S,
   wherein the sequence number is a first inverse non-zero value of the column vector corresponding to the first check bit in the generator matrix;

or the sequence number is a last sequential non-zero value of the column vector corresponding to the first check bit in the generator matrix.

4. The method according to claim 1, wherein the first check bit is a cyclic redundancy check (CRC) bit.

5. The method according to claim 1, wherein the first encoded code word is encoded according to a generator polynomial.

6. A decoding method for a decoding device, the method comprising:
   obtaining, by the decoding device, a second encoded code word to be decoded, wherein the second encoded code word is obtained by encoding a first encoded code word, and the first encoded code word comprises a plurality of information bits and a plurality of check bits, wherein the first check bit of the plurality of check bits is positioned after S information bits and before $(S+1)^{th}$ information bit of the first encoded code word, and S equals to a number of information bits related to the first check bit and is an integer of at least 1; and
   polar decoding the second encoded code word.

7. The method according to claim 6, wherein the first check bit is a cyclic redundancy check (CRC) bit.

8. The method according to claim 6, wherein the first encoded code word is encoded according to a generator polynomial.

9. The decoding method for a decoding device according to claim 6, wherein the polar decoding the second encoded code word comprises:
   polar decoding each bit of the second encoded code word in sequence and outputting current M survivor paths according to L survivor paths previously output wherein L is an integer not smaller than 1 and not greater than a first integer, M is an integer not smaller than 1 and not greater than the first integer, and the M survivor paths comprise information related to decoded information bits.

10. An encoding device, comprising:
    an encoder, configured to encode a plurality of information bits to obtain a first encoded code word that includes the plurality of information bits and a plurality of check bits, wherein the first check bit of the plurality of check bits is positioned after S information bits and before $(S+1)^{th}$ information bit of the first encoded code word, where S equals to a number of information bits related to the first check bit and is an integer of at least 1; and
    the encoder is further configured to polar encode the first encoded code word to obtain a second encoded code word.

11. The encoding device according to claim 10, wherein the encoder is further configured to obtain the value of S of the first check bit according to a sorting value of a column vector of a generator matrix corresponding to the first check bit.

12. The encoding device according to claim 11, wherein the encoder is further configured to obtain a sequence number of a first inverse non-zero value of the column vector corresponding to the first check bit in the generator matrix, as the value of S; or
    obtain a sequence number of a last sequential non-zero value of the column vector corresponding to the first check bit in the generator matrix, as the value of S.

13. The encoding device according to claim 10, wherein the check bit is a cyclic redundancy check (CRC) bit.

14. The encoding device according to claim 10, wherein the first encoded code word is encoded according to a generator polynomial.

15. The encoding device according to claim 10, wherein the encoding device further comprising:
    a transceiver, configured to send the second encoded code word.

16. A decoding device, comprising:
    a transceiver, configured to obtain a second encoded code word to be decoded, wherein the second encoded code word is obtained by encoding a first encoded code word, and the first encoded code word includes a plurality of information bits and a plurality of check bits, wherein the first check bit of the plurality of check bits is positioned after S information bits and before $(S+1)^{th}$ information bit of the first encoded code word, wherein S equals to a number of information bits related to the first check bit and is an integer of at least 1; and
    at least one processor, configured to polar decode the second encoded code word.

17. The decoding device according to claim 16, wherein the first check bit is a cyclic redundancy check (CRC) bit.

18. The decoding device according to claim 16, wherein the first encoded code word is encoded according to a generator polynomial.

19. The decoding device according to claim 16, the at least one processor is further configured to polar decode each bit of the second encoded code word in sequence, and output current M survivor paths according to L survivor paths output last time, wherein L is an integer not smaller than 1 and not greater than a first integer, M is an integer not smaller than 1 and not greater than the first integer, and the M survivor paths comprise information related to the decoded information bits.

\* \* \* \* \*

UNITED STATES PATENT AND TRADEMARK OFFICE
CERTIFICATE OF CORRECTION

PATENT NO. : 10,536,171 B2
APPLICATION NO. : 16/131879
DATED : January 14, 2020
INVENTOR(S) : Li et al.

Page 1 of 1

It is certified that error appears in the above-identified patent and that said Letters Patent is hereby corrected as shown below:

In the Specification

In Column 15, Line 40, delete "an St'" and insert -- an Sth --, therefor.

In the Claims

In Column 18, Claim 2, Line 57, delete "the" and insert -- wherein the --, therefor.

In Column 20, Claim 19, Line 42, delete "the" and insert -- wherein the --, therefor.

Signed and Sealed this
Fourth Day of October, 2022

Katherine Kelly Vidal
*Director of the United States Patent and Trademark Office*